US009361412B1

(12) United States Patent
Hilde

(10) Patent No.: US 9,361,412 B1
(45) Date of Patent: Jun. 7, 2016

(54) METHOD FOR THE SIMULATION OF LADAR SENSOR RANGE DATA

(71) Applicant: THE UNITED STATES OF AMERICA AS REPRESENTED BY THE SECRETARY OF THE NAVY, Washington, DC (US)

(72) Inventor: Jeffrey J. Hilde, Onyx, CA (US)

(73) Assignee: The United Sates of America as Represented by the Secretary of the Navy, Washington, DC (US)

(*) Notice: Subject to any disclaimer, the term of this patent is extended or adjusted under 35 U.S.C. 154(b) by 613 days.

(21) Appl. No.: 13/886,060

(22) Filed: May 2, 2013

Related U.S. Application Data

(63) Continuation-in-part of application No. 13/849,649, filed on Mar. 25, 2013.

(60) Provisional application No. 61/615,801, filed on Mar. 26, 2012.

(51) Int. Cl.
*G06F 7/60* (2006.01)
*G06F 17/50* (2006.01)

(52) U.S. Cl.
CPC .................................. *G06F 17/5009* (2013.01)

(58) Field of Classification Search
CPC ........................................... G06F 17/5009
USPC ............................................................ 703/2
See application file for complete search history.

(56) References Cited

U.S. PATENT DOCUMENTS

| 5,576,964 | A | * | 11/1996 | Choate | G01C 21/165 382/106 |
| 6,307,959 | B1 | * | 10/2001 | Mandelbaum | G06T 7/0065 382/104 |
| 7,187,452 | B2 | * | 3/2007 | Jupp | G06K 9/0063 356/3.01 |
| 7,961,301 | B2 | * | 6/2011 | Earhart | G01S 3/7867 356/4.01 |
| 8,249,310 | B2 | * | 8/2012 | Okubo | G06K 9/00248 345/615 |
| 2005/0232463 | A1 | * | 10/2005 | Hirvonen | G06K 9/00805 382/103 |
| 2006/0008119 | A1 | * | 1/2006 | Chang | G06K 9/00208 382/103 |
| 2006/0182314 | A1 | * | 8/2006 | England | G01C 15/002 382/106 |

(Continued)

OTHER PUBLICATIONS

Greene et al. ( "Hierarchial z-buffer Visibility", Computer Graphics Proceedings, Annual Conference Series, pp. 231-238, Aug. 1- 6, 1993).*

(Continued)

*Primary Examiner* — Omar Fernandez Rivas
*Assistant Examiner* — Iftekhar Khan
(74) *Attorney, Agent, or Firm* — James M. Saunders

(57) ABSTRACT

A method for simulating sensor range data includes providing a pulse model configured to generate a sequence of discrete energy pulses. A sequences of flashes associated with the pulse model are electronically generated. Each flash in the sequence of flashes has at least one range value. A sequence of scans is electronically generated from the sequence of flashes. Each scan in the sequence of scans has at least one flash. The sequences of scans is a simulation of sensor range data. The simulation of sensor range data is output in a tangible medium.

8 Claims, 9 Drawing Sheets

(56) References Cited

U.S. PATENT DOCUMENTS

| | | | |
|---|---|---|---|
| 2007/0031064 A1* | 2/2007 | Zhao | G06K 9/00214 382/285 |
| 2010/0106420 A1* | 4/2010 | Mattikalli | G06T 17/05 702/2 |
| 2010/0111444 A1* | 5/2010 | Coffman | G06T 7/0075 382/285 |
| 2011/0273442 A1* | 11/2011 | Drost | G06K 9/6211 345/419 |
| 2012/0121132 A1* | 5/2012 | Asahara | G06K 9/00201 382/103 |
| 2012/0143808 A1* | 6/2012 | Karins | G06N 7/005 706/46 |
| 2013/0246020 A1* | 9/2013 | Zeng | G06N 7/005 703/2 |
| 2014/0002444 A1* | 1/2014 | Bennett | G06F 3/012 345/419 |

OTHER PUBLICATIONS

Haala, et al. ("Generation of 3D city models from airborne laser scanning data" the 3rd EARSEL workshop on Lidar Remote Sensing on Land and Sea, Tallinn, 105-112, 1997).*

Eric A. Buschelman, ("A Nonparametric Approach to Segmentation of Ladar Images", USAF, 2012).*

Jason R. McMahon ("Improving Range Estimation of a 3-Dimensional Flash Ladar Via Blind Deconvolution ", USAF 2010).*

* cited by examiner

US 9,361,412 B1

METHOD FOR THE SIMULATION OF LADAR SENSOR RANGE DATA

CROSS-REFERENCE TO RELATED APPLICATIONS

This is a continuation-in-part application, claiming the benefit of parent non-provisional application Ser. No. 13/849, 649 filed on Mar. 25, 2013, whereby the entire disclosure of which is incorporated herein by reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to sensors and, more particularly, to a new way of simulating sensor range data.

Figure 1:
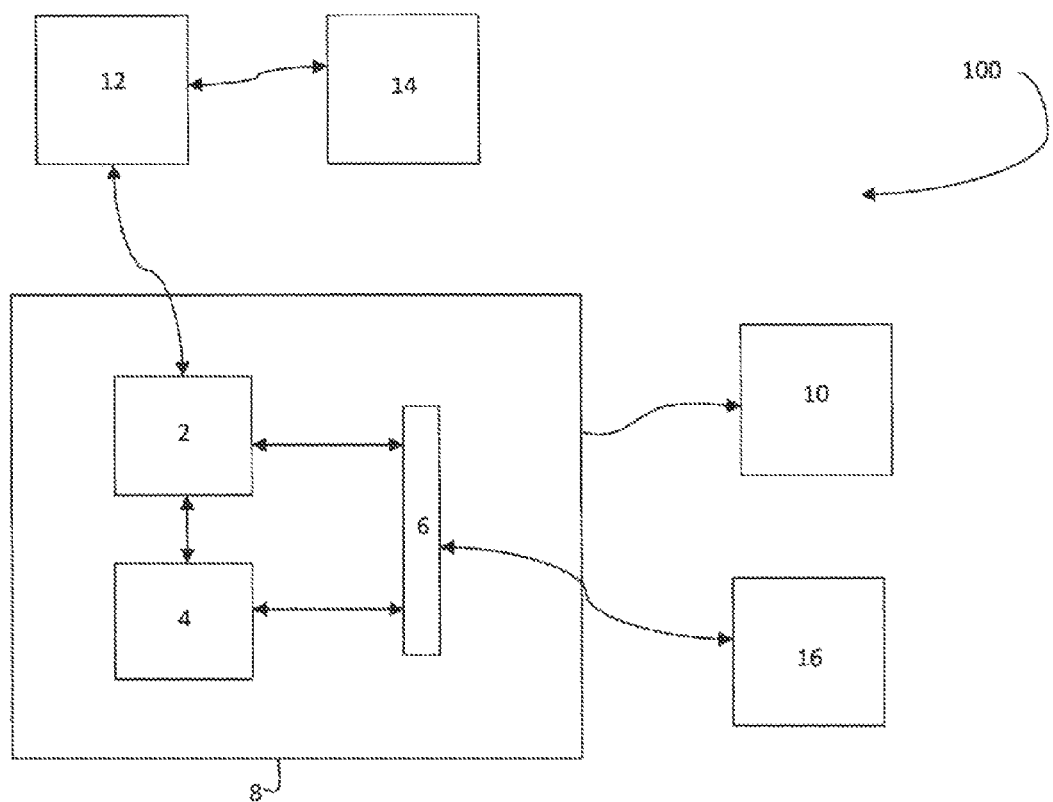
FIG. 1 illustrates components of some systems and or articles of manufacture, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

The invention generally relates to sensors and, more particularly, to a new way of simulating sensor range data. This technology relates generally to computer modeling and simulation, sometimes referred to as synthesis. More particularly, this technology relates to an algorithm which employs computer graphics hardware in the synthesis of LADAR video for use in LADAR sensor prototyping, construction, testing, demonstration, validation, analysis and sensor function prediction, and for use in artificial, machine, or robotic intelligence systems where the use of LADAR sensors are employed. Specifically, while the hidden surface removal z-buffer of computer graphics hardware is constructed and intended to do fast hidden surface removal in the process of producing a two-dimensional projection of a three-dimensional textured wire-frame using hundreds of core processing units on a single graphics processing card, this technology employs the computing power of the hidden surface removal z-buffer, sometimes referred to as z-buffer for short, in a novel way resulting in real-time, accurate LADAR sensor range data video.

This technology provides a unique solution for LADAR Data Synthesis (LADASY), a method of generating LADAR range data using computer hardware and software. This technology defines a wire-frame scene model, a laser pulse model, the novel use of the hidden surface removal z-buffer, and an algorithm, all a function of time, that produces LADAR range data that would have been the output of an actual LADAR sensor given that the actual scene and laser pulse of the sensor were the same as was modeled. Entire time sequences of LADAR data can be synthesized by applying this algorithm for each laser pulse in time of the LADAR sensor that contributed to the data stream time sequence. This gives great advantage in the visualization of LADAR sensor data for purposes of construction prototyping, testing and demonstration before the sensor has been built and sensor validation, analysis and sensor function prediction after the sensor has been built. It also provides function for robotic intelligence systems where there is a requirement to hypothesize a scene and synthesize sensor output for comparison with the LADAR sensor actual output.

Although embodiments of the invention are described in considerable detail, including references to certain versions thereof, other versions are possible. Examples of other versions include performing the tasks in an alternate sequence or hosting embodiments on different platforms. Therefore, the spirit and scope of the appended claims should not be limited to the description of versions included herein.

At the outset, it is helpful to describe various conventions and parameters associated with embodiments of the invention.

Range Imaging Sensor

A range-imaging sensor is any combination of hardware and software capable of producing a range image of a real-world scene under appropriate operating conditions. In some embodiments, a Laser Detection and Ranging (LADAR) sensor is used to generate the range data from which a range image is generated.

Range Image

A range image is an image of a physical scene represented in an electronic data structure as a collection of electronic distance measurements (electronic data) from a known reference coordinate system to surface points on object(s) in the scene. When scenes are defined as collections of physical objects and when each object is defined by its mass density function, then surface points are defined as the 3-D points in the halfdensity level set of each object's normalized mass-density function as in Koenderink and VanDoorn (1986). Range images are known by many other names depending on context: range map, depth map, depth image, range picture, rangepic, 3-D image, 2.5-D image, digital terrain map (DTM), topographic map, 2.5-D primal sketch, surface profiles, xyz point list, contour map, and surface height map. When the distance measurements in a range image are listed relative to three orthogonal coordinate axes, the range image is in xyz form.

When the distance measurements indicate range along 3-D direction vectors indexed by two integers (i,j), the range image is in $d_{i,j}$ form. Any range image in $d_{i,j}$ form can be converted directly to xyz form, and the x,y,z form as used to represent the target model are converted into the range image $d_{i,j}$ form. Since no ordering of points is required in the xyz form, this is the more general form, but it can be more difficult to process than the $d_{i,j}$ form.

When the sampling intervals are consistent in the x- and y-directions of an xyz range image, it can be represented in the form of a large matrix of scaled, quantized range values $d_{i,j}$ where the corresponding x, y, z coordinates are determined implicitly by the row and column position in the matrix and the range value. The term "image" is used because any $d_{i,j}$ range image can be displayed on a video monitor, and it is identical in form to a digitized video image from a television camera. The only difference is that pixel values represent distance in a range image whereas they represent irradiance (brightness) in a video image.

For the purposes of this description, range images are described as being operated on in the $d_{i,j}$ form, but can easily be converted to xyz range form using a standard transformation matrix and offsets.

Sensor Range Image

A "sensor range image" is a range image of a scene that includes a detected target. The sensor range image is notationally defined as D={$d_{ij}$, i=1, ... b, j=1 ... c}, where b is the number of columns of pixels in the sensor target range image, c is the number of rows of pixels in the sensor range image, and $d_{i,j}$ represents the range between the object at point ij in the sensor range image and the sensor. The scene coordinate frame of reference is the coordinate system with respect to which range values in the range image are calculated.

Rendering

In general, given a 3D scene model and a sensor type, one can compute the image that would be recorded by a sensor or that type from the specified scene. This computation is referred to as "rendering". A range sensor provides depth information such as, for example, the distance from the imaging device. For a range sensor, the resulting rendered image is sometimes referred to as a "synthetic range image" or "simulated range image." In this case, rendering can be carried out using a hardware Z-buffer, which is computationally efficient. Alternatively, the rendering can be carried out by software. The process is referred to as "range rendering." The field has an extensive literature and range rendering using conventional techniques is known to a person having ordinary skill in the art.

The concept of rendering may be generalized to computing, from a 3D scene model, what would be obtained when an image were recorded and subsequently processed in some way. One example of this is "feature-based rendering." Each object has features which are computed and stored with the object. Feature based rendering computes how those features would appear in the 3D scene model to an observer. Occlusion is used to determine which features are visible, but the appearance of features is computed by projection or some other technique. Hence it is convenient to use "rendering" or "simulated rendering" to describe the process of computing the information that is expected to appear in the image of a 3D scene model from an observer at whatever level is appropriate. Particular examples of "rendering" are range rendering, photo-realistic rendering, and feature-based rendering.

Figure 4:
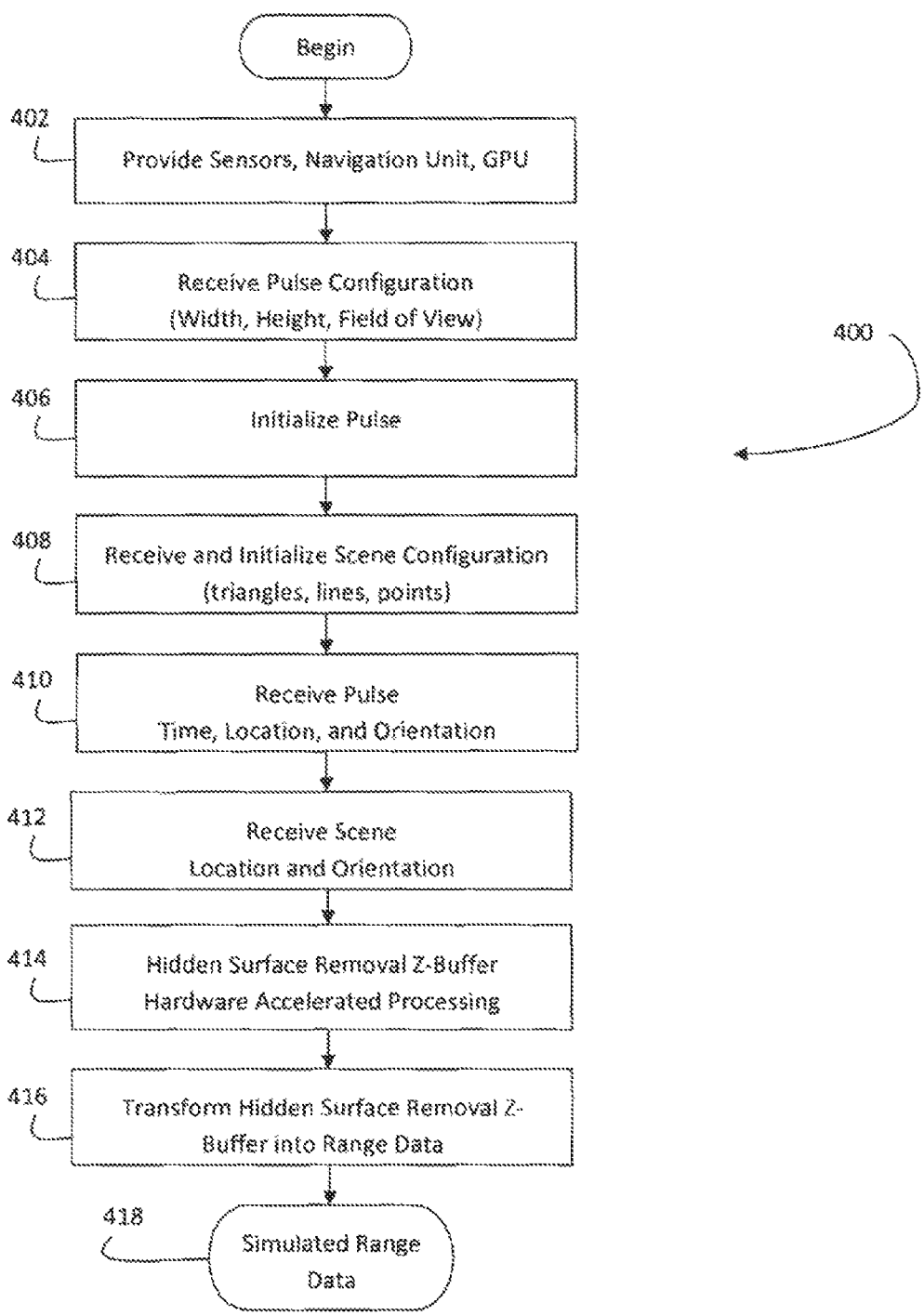
FIG. 4 is an exemplary block process diagram, according to some embodiments of the invention.

In some embodiments, rendering is performed by a graphics processing unit programmed to perform the steps/acts/processes as illustrated in FIG. 4. With reference to FIG. 4, an actual sensor associated with a navigation unit is provided. A virtual sensor (sometimes referred to as a modeled sensor) associated with a graphics processing unit is also provided. The actual sensor is defined in an actual three-dimensional space frame of reference by a position, orientation, width, height, and field of view (block 402). These embodiments render the simulated range image by defining sensor parameters for the sensor model that is used to create the simulation that represents the range image (block 404). In particular, this task involves defining a width and height based on the angle values of the field of view of the modeled sensor.

With reference to block 406, a pulse is then initialized by configuring the pulse/energy according to constraints imposed by the model sensor parameters. This includes, 1) the energy transmitted by the sensor model is defined to be transmitted in the same direction (in the scene coordinate frame of reference) as the actual sensor is looking so that a return will be measured; and 2) the pulse dimensions are defined to be equal to the angular dimensions of the field of view of the actual sensor.

A scene model (background and target model) is initialized using the 3-D target model of the current model hypotheses set (block 408) in the model frame of reference. Next, with reference to block 410, location and orientation of the actual sensor is received from the navigation unit, (which outputs xyz location and orientation of the actual sensor in the "scene coordinate system frame of reference"), and uses this information to define the xyz location and orientation of the modeled sensor in the scene coordinate system frame of reference.

Next, with reference to block 412, the scene location and orientation is received. At this point, the imaged scene model is defined in xyz form in the scene coordinate frame of reference.

Next, with reference to block 414, hidden surface removal z-buffer data of the scene model is generated. The hidden surface removal z-buffer is initialized to an initial value. The parts of the hidden surface removal z-buffer that remain unchanged retain the initial value (which allows them to be distinguished from the parts of the target that reflected the sensor pulse). The hidden surface removal z-buffer data is an array of z order index values, with at least one z order index value for each timing detector element of the sensor focal plane array. This computer graphics hardware processing, also known as hardware accelerated processing, can be invoked and results obtained using OpenGL by calling the glReadPixels function. Note that there is at least one hidden surface removal z-buffer z order index for each detector in the sensor focal plane array.

Next, with reference to block 416, the hidden surface removal z-buffer data is transformed into sensor range data, which defines the simulated range image. Block 416 reads the z order index values from the hidden surface removal z-buffer computed with the computer graphics hardware and transforms them into a range value or multiple range values (as often happens when for example the pulse reflects from the leaves of a tree and from the ground below the tree giving more than one range value) for each detector in the sensor focal plane array having linear units of length. The hidden surface removal z-buffer is read using OpenGL as:

glReadPixels (0, 0, width, heigth, GL_Z_COMPONENT, GL_FLOAT, zBuf):

where, width and height in angular measure of the LADAR energy pulse and of the zBuf array which is where the hidden surface removal z-buffer computational result is obtained on call return.

Hidden Surface Removal Z-Buffer

In the field of computer graphics a camera model and a set of polygons defining the scene surface are the two main elements used to generate a computer graphics color image. In the generation of this image is a requirement to determine the visible parts of the polygon surfaces. One technique that is commonly used is called the hidden surface removal z-buffer method, sometimes also referred to as a depth-buffer method. This method employs two buffers, one used to record depth and the other one used to record color. As is normally done when this method completes, the color buffer is used as a color image and the hidden surface removal z-buffer having no further use is cleared in preparation for the generation of the next color image.

For each element of the hidden surface removal z-buffer and among all the polygons of the scene, the hidden surface removal z-buffer works by finding the polygon and a point on the surface of the polygon that is closest to the camera and in the line-of-sight of the camera pixel corresponding to the z-buffer element. Each z-buffer element is associated with a line that begins at the camera and is directed by the line-of-sight for the camera pixel corresponding to the z-buffer element. This line may intersect many of the polygons and for each of these intersections a z order index is computed that is the order of the intersection from the camera. Each z order index is compared to the current z order index recorded for that z buffer element in a hidden surface removal z-buffer that has a space to record a z order index for each camera pixel in the image. When the z order index is ahead of the previous z order index, then the previous z order index is recorded over with the current z order index and a color for this intersection is recorded in the color buffer. Finally, when all the intersections have been processed, the color buffer contains the desired color image and only the visible parts of the polygons will be showing in the image.

Apparatus Embodiments

With reference to FIG. 1, apparatus/system embodiments include a Central Processing Unit (CPU) 2 operatively associated with electronic memory 4 and a graphics processing unit (GPU) 6, operatively associated with a display monitor 10, to display a visual depiction of the synthetic range image. The central processing unit 2 is the hardware within a computer that carries out the instructions of a computer program by performing the basic arithmetical, logical, and input/output operations of the system. The CPU 2 is operatively associated with memory 4, which includes data and stored instructions. The CPU 2 and memory 4 are both operatively associated with the GPU 6. The GPU 6, also known as a visual processing unit (VPU), is a specialized electronic circuit constructed to rapidly manipulate and alter memory to accelerate the building of images in a frame buffer intended for output to a display. The memory 4 receives input, and stores software, which the CPU 2 and GPU 6 use to perform the processes described herein.

Reference character 8 designates a motherboard, to which the CPU 2, memory 4, and GPU 6 are electrically associated. Reference character 10 is the visual display monitor (screen) to display a visual depiction of the simulated range image. In some applications, depending on the verification requirements, a visual verification by a user is important to provide an additional layer of validation before acting on the processing result (for example dedicating resources to attack based on the processing result). Some embodiments, therefore, include the display monitor 10, which is sometimes referred to as a visual display screen.

Reference character 12 is a navigation unit such as, for example, one associated with an airborne vehicle. The navigation unit 12 is associated with an actual sensor 14, configured to receive signals. The navigation unit 12 is configured to communicate with the CPU 2. Reference character 16 is a virtual sensor (a modeled sensor) associated with the GPU 6 and is used to simulate sensor range data. The actual and virtual sensors 14 & 16 may also be referred to as first and second sensors.

Article of Manufacture

Article of manufacture embodiments are directed to non-transitory processor readable medium(s) having stored thereon processor executable instructions that, when executed by the processor(s), cause the processor to perform the process(es) described herein. The term non-transitory processor readable medium include one or more non-transitory processor-readable medium (devices, carriers, or media) having stored thereon a plurality of instructions, that, when executed by the electronic processor (typically a central processing unit—an electronic circuit which executes computer programs, containing a processing unit and a control unit), cause the processor to process/manipulate/act on data according to the plurality of instructions (defined herein using the process/function form). The non-transitory medium 6 can be any non-transitory processor readable medium (media), including, for example, a magnetic storage media, "floppy disk", CD-ROM, RAM, a PROM, an EEPROM, a FLASH-EPROM, any other memory chip or cartridge, a file server providing access to the programs via a network transmission line, and a holographic unit. Of course, those skilled in the art will recognize that many modifications may be made to this configuration without departing from the scope.

In some system embodiments, the electronic processor is co-located with the processor readable medium. In other system embodiments, the electronic processor is remotely located from the processor readable medium. It is noted that the steps/acts/processes described herein including the figures can be interpreted as representing data structures or sets of instructions for causing the computer readable medium to perform the step/act/process. Identifying or 'electronically identifying' involves any one or more of the following: 1) associating an electronic marker, tag, or value with the target model that identifies it as a match; 2) storing data associated with the target model or the parameters of the best match hypothesis in memory at a location indicative that the hypothesis/model matches the target; 3) displaying the simulated range image on an visual display; or 4) any conventional means of identifying a target model as a match.

Certain embodiments of the invention may take the form of a computer program product on a computer-usable storage medium having computer-usable readable program instructions embodied in the medium. Any suitable computer readable medium may be utilized including either computer readable storage media, such as, for example, hard disk drives, CD-ROMs, optical storage devices, or magnetic storage devices, or a transmission media, such as, for example, those supporting the internet or intranet.

Computer-usable readable program instructions for carrying out operations of embodiments of the invention may be written in an object oriented programming language such as, for example, Python, Visual Basic, or C++. However, computer-usable/readable program instructions for carrying out operations of embodiments of the invention may also be written in conventional procedural programming languages, such as, for example, the "C#" programming language or an engineering prototyping language such as, for example, MATLAB®. The computer-usable/readable program instructions may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider or any other method known in the art).

Embodiments of the invention are described in part below with reference to flow chart illustrations and/or block diagrams of methods and computer program products according to embodiments of the invention. It will be understood that each block of the flow chart illustrations and/or block diagrams, and combinations of blocks in the flow chart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow chart and/or block diagram block or blocks.

These computer program instructions may also be stored in a computer-readable memory, including RAM, that can direct a computer or other programmable data processing apparatus to function in a particular manner, such that the instructions stored in the computer-readable memory produce an article of manufacture including instructions that implement the function/act specified in the flow chart and/or block diagram block or blocks.

These computer program instructions may also be loaded onto a computer or other programmable data processing apparatus to cause a series of operational tasks to be performed on the computer or other programmable apparatus to produce a computer implemented process such that the instructions that execute on the computer or other programmable apparatus provide tasks for implementing the functions/acts specified in the flow chart and/or block diagram block or blocks.

In the accompanying drawings, like reference numbers indicate like elements. FIG. 1 illustrates the components of some systems and/or articles of manufacture, according to embodiments of the invention. Reference character 100 depicts an apparatus of embodiments of the invention. The individual components depicted in FIG. 1 function together to perform the disclosed methods.

Figure 2:
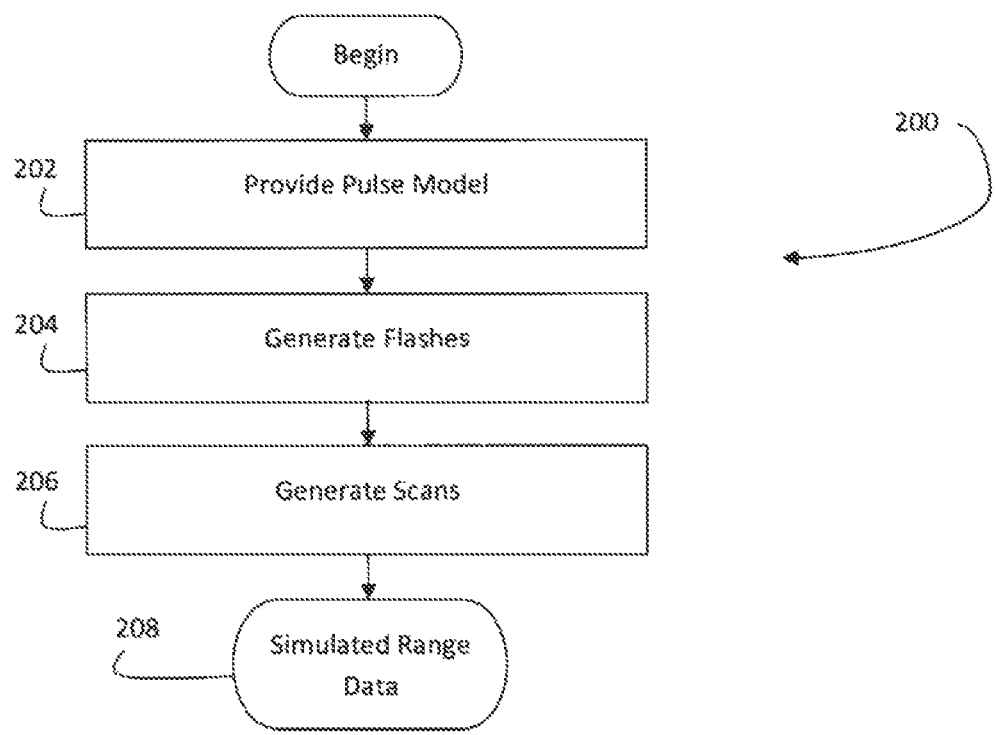
FIG. 2 is an exemplary block process diagram, according to some embodiments of the invention.

FIG. 2 illustrates an exemplary block process diagram, according to some embodiments of the invention. Embodiments of the invention generally relate to a method for electronically simulating sensor range data. The method is depicted as reference character 200. The method includes providing a pulse model configured to generate a sequence of discrete energy pulses (task 202). A sequence of flashes associated with the pulse model is electronically generated (task 204). Each flash in the sequence of flashes has at least one range value. A sequence of scans is electronically generated from the sequence of flashes (task 206). Each scan in the sequence of scans has at least one flash. The sequence of scans is a simulation of sensor range data. The simulation of sensor range data is output in a tangible medium (task 208).

Figure 3:
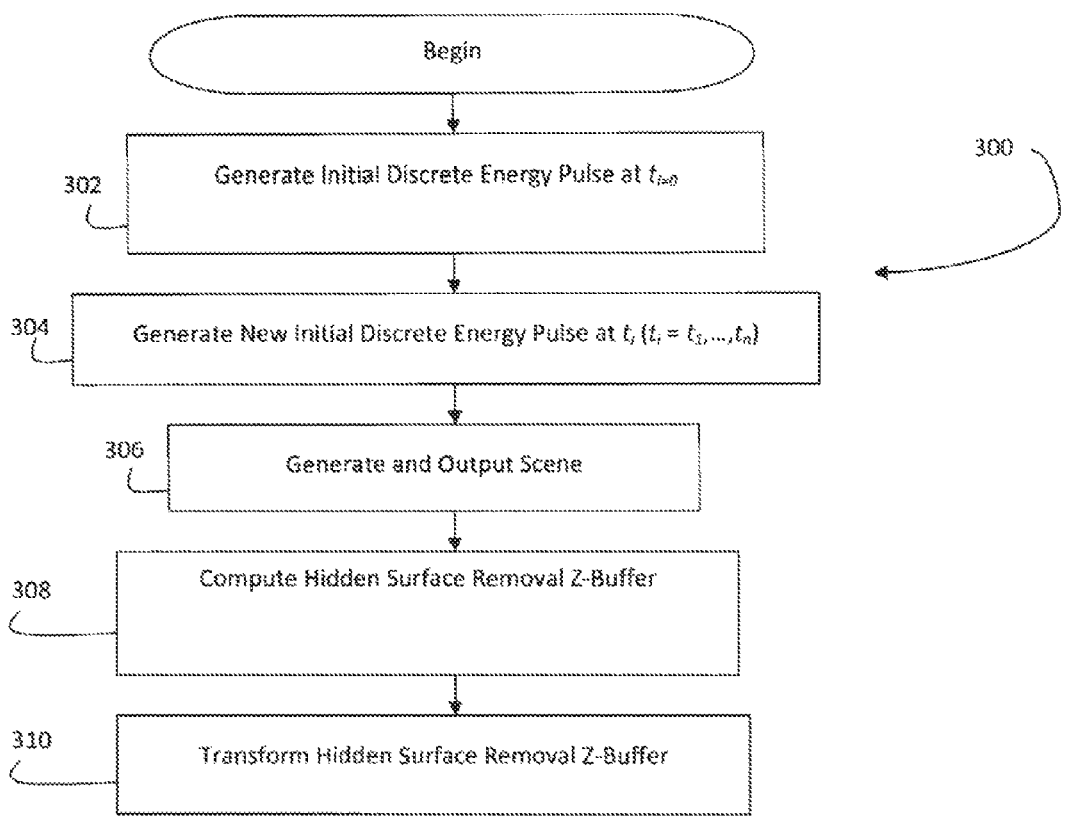
FIG. 3 is an exemplary block process diagram, according to some embodiments of the invention.

FIG. 3 is an exemplary block process diagram, according to some embodiments of the invention. A set of discrete energy pulse sequence production tasks, shown in the aggregate as reference character 300, is performed using the pulse model. An iteration of the set of discrete energy pulse sequence production tasks is performed when more than one discrete energy pulse is used. Each of the discrete energy pulses includes position and orientation information in three-dimensional space.

An initial discrete energy pulse is generated at time $t_{i=0}$, where i is the iteration index, on the first iteration of the set of discrete energy pulse sequence production tasks (task 302). A new discrete energy pulse is generated at tune $t_i$, where $t_i = t_1, \ldots, t_n$, for subsequent iterations of the set of discrete energy pulse sequence production tasks (task 304). A scene is generated from a dedicated scene model associated with each of the discrete energy pulses in the set of discrete energy pulses. The scene is output as a collection of points defined in three-dimensional space (task 306). A hidden surface removal z-buffer is computed using the scene associated with time t from the scene model and the pulse position and orientation at time t from the pulse energy model (task 308). The hidden surface removal z-buffer is transformed into an array of pulse energy wave forms impinging on each sensor detector timing element as a function of time. Each of the pulse energy wave forms are processed to determine a timing element trigger time and then sealed by the pulse velocity to obtain range for each time element (task 310). The computations are performed for each range value.

Task 304 through 310 may be iterated through until a user-selected parameter is accomplished. Example parameters to determined when the iteration is complete includes, but is not limited to, mission completion, a particular number of flashes being generated, more than one hidden surface z-buffer being generated, target repositioning, and the method being performed for a particular length of time. In the latter case, the iteration would occur, for example, until time $t_i \geq a$ simulation time, $T_s$, where the simulation time, $T_s$ is predetermined by the user based on application-specific conditions.

Each flash in the sequence of flashes is a width by height sub-scan array of range values produced from one discrete energy pulse that are the sensor range values at time $t_i$ from a sensor pulse at time $t_i$ defined by the pulse model, and the surface of the scene at time $t_i$ defined by the scene model. Each scan in the sequence of scans is the collection of flashes resulting from the set of discrete energy pulse sequence production tasks having modulated orientations constructed into the pulse model to systematically cover the scene.

Figure 5:
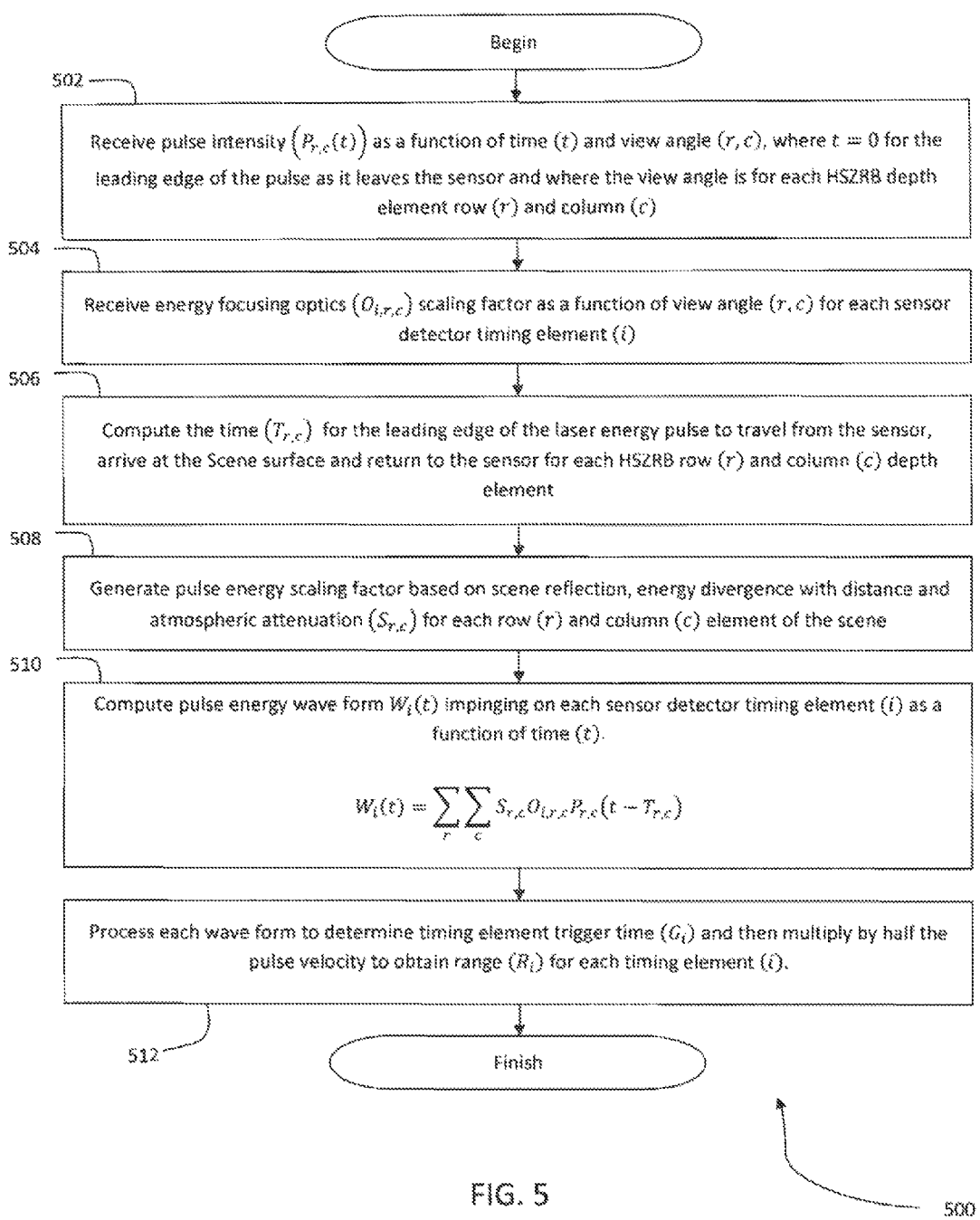
FIG. 5 is an exemplary block process diagram of transforming a hidden surface removal z-buffer, according to some embodiments of the invention.

FIGS. 4 and 5 are block process diagrams, according to some embodiments of the invention. In particular, both relate to simulating sensor range data using a non-transitory computer-readable medium. In particular, FIG. 5 is an exemplary block process diagram of transforming a hidden surface removal z-buffer, according to some embodiments of the invention. FIGS. 4 and 5 are equally applicable to method and article of manufacture embodiments.

Referring to FIG. 4, simulating sensor range data using a non-transitory computer-readable medium, depicted as reference character 400, includes providing an actual sensor associated with a navigation unit, and a virtual sensor associated with a graphics processing unit. The actual sensor is defined in an actual three-dimensional space frame of reference (task 402). Unless otherwise noted, references to the word "sensor" with respect to FIGS. 4 and 5 refer to the virtual sensor, which is also sometimes referred to as the modeled sensor.

A pulse model configuration is received with the virtual sensor (task 404). The pulse model configuration defines the parameters for the virtual sensor, where the pulse model is defined in three-dimensional space frame of reference and by a width, height, and field of view. The pulse model configuration is electronically initialized by generating an initial discrete energy pulse at time t, according to the parameters for the virtual sensor (task 406). The energy transmitted by the pulse model configuration is in the same direction as the actual sensor's transmitted energy pulse, specifying direction with respect to a three-dimensional space frame of reference.

A scene model configuration is received with the virtual sensor, and electronically initialized using the three-dimensional space frame of reference of the pulse model configuration (task 408). The scene model configuration is defined by a set of points, lines, or polygons.

An actual pulse having time, location, and orientation information is received from the navigation unit with the actual sensor (task 410). The actual pulse is defined by the time, location, and orientation information in a three-dimensional x, y, z, space frame of reference of the scene model configuration.

A scene location and orientation of land, sea, air, and objects composing the scene model, including the pose of the scene target model in the scene coordinate frame of reference is received (task 412). In certain embodiments, task 412 may be preceded by an iterative process until a user-selected parameter is reached. One example of this includes iterating until a certain time elapses such as, for example, a simulation time. For example, this may include an electronic determination of whether a pulse time is greater than a predetermined simulation time.

A hidden surface removal z-buffer is electronically generated using the scene model associated with time t from the scene model and the pulse position and orientation at time t from the pulse energy model, and initializing the hidden surface removal z-buffer to an initial value (task 414). All z order index values that remain unchanged retain the initial hidden surface removal z-buffer value (which allows them to be distinguished from z order index values that lie on the target). The hidden surface removal z-buffer data is an array of z order index values, with at least one z order index value for each range value of the sensor focal plane array. The hidden surface removal z-buffer is electronically transformed into range data values defining a simulated range image (task 416). More than one hidden surface removal z-buffer may be generated and, in those instances, tasks 506 through 512 (discussed below with respect to FIG. 5) would be iterated through until all of the hidden surface removal z-buffers are transformed into range data (task 416). Simulated sensor range data is output in a tangible medium (task 418).

The transformation task (task is 416) is further refined and is depicted on FIG. 5, in the aggregate as reference character 500. Transforming the hidden surface removal z-buffer data task (task 416), includes receiving (from a pre-determined construction of the sensor laser and optics) pulse intensity ($P_{r,c}(t)$) as a function of time (t) and view angle (r,c), where t=0 for the leading edge of the pulse as it leaves the sensor and where the view angle is for each hidden surface removal z-buffer element row (r) and column (c) (task 502). The pulse intensity is based on the predetermined sensor parameters including sensor optics.

An energy focusing optics ($O_{i,r,c}$) scaling factor is received from the predetermined sensor construction parameters including optics and detector timing element geometrical layout. The energy focusing optics ($O_{i,r,c}$) scaling factor is a function of view angle (r,c) for each sensor detector timing element (i) (task 504).

Task 506 is the computation of the time ($T_{r,c}$) for the leading edge of the laser energy pulse to travel from the sensor, arrive at the Scene surface and return to the sensor for each hidden surface removal z-buffer row (r) and column (c) element. A person having ordinary skill in the art will recognize that time may be computed in a variety of ways such as, for example, by solving for time knowing that the simple relationship of velocity being distance divided by time.

Task 508 generates a pulse energy scaling factor based on scene reflection, energy divergence with distance and atmospheric attenuation ($S_{r,c}$) for each row (r) and column (c) element of the scene. A pulse energy wave form $W_i(t)$ impinging on each sensor detector timing element (i) as a function of time (t) is computed in task 510, such that:

$$W_i(t) = \sum_r \sum_c S_{r,c} O_{i,r,c} P_{r,c}(t - T_{r,c}).$$

Task 512 processes each pulse energy wave form to determine the set of timing element trigger times ($G_i$) and then multiplying each of these trigger times by half the pulse velocity to obtain a set of range values ($R_i$) for each sensor detector timing element (i). The set of range values ($R_i$) is the result of the method embodied in tasks 402 through 418 on FIG. 4, also known as the simulated sensor range data, which is output in a tangible medium (task 418).

In embodiments, the pulse model is selected from the group of pulsed energy sensor systems consisting of LADAR, LIDAR, RADAR, and SONAR. The scene model simulates the geometrical surface of land, sea, air, and objects composing the scene for which sensor data is to be simulated. The scene model is represented as a collection of points that are positioned in three-dimensional space. The scene model is a function of time, $t_i$.

In some embodiments, the pulse model simulates for a single energy pulse in time, a single range value having associated pulse origin position, direction, and time. In other embodiments, the pulse model simulates for a single energy pulse in time, an array of range values having associated pulse origin position and time, and directions unique to each range value in the array of range values.

In embodiments, the tangible outputs may be shown and/or represented as a visual display screen depiction, hard copy printouts, as well as other media using classification/matching information such as, for example, a computer having computer-readable instructions that is configured to use output from embodiments of the invention. The output may be used in programs using the output such as, for example, in automatic target recognition (ATR) algorithms.

While this technology is primarily described using LADAR, other pulsed energy sensor systems such as RADAR, SONAR, and LIDAR can also be simulated using this technology. OpenGL is a software interface to computer graphics hardware and will be used here to detail the novel application of graphics hardware to the synthesis of LADAR Range data. There are other software interfaces to computer graphics hardware, but OpenGL is convenient and will be used here.

A Laser Pulse Model simulates for a single laser pulse in time 1) a single range value with associated pulse origin position, direction and time, or 2) a regular array of range values with associated pulse origin position and time, but with directions unique to each range value, yet directions regular with respect to each other as constrained by typical computer graphics hardware when perspective rendering is used. The laser pulse is laser energy released at one time by the LADAR sensor and the collection of this energy after being reflected back from the scene surface is onto a focal plane array of laser energy detectors. The important parameters for the Laser Pulse Model configuration are specified as required by the Depth Buffer Computation using OpenGL as:
glViewport(0, 0, w, h);
gluPerspective(fovy, aspect, zNear, zFar);
where, w is the width of the z-buffer, h is the height of the z-buffer, fovy is the width in angle and aspect is the ratio of the width in angle to the height in angle, all with respect to specifying the LADAR pulse. The zNear is a graphics hardware implementation constraint that specifies a clipping plane where all surfaces nearer than this will be clipped and invisible. Similarly, zFar specifies a clipping plane where all surfaces farther than this will be clipped away and not visible.

The Position & Orientation of the laser pulse simulated by the Laser Pulse Model is defined in three-dimensional space. This includes the roll of the LADAR pulse in the case where the shape of the pulse is not circular. These Laser Pulse Model outputs are specified as required by the Depth Buffer Computation using OpenGL as: gluLookAt(posX, posY, posZ, dirX, dirY, dirZ, upX, upY, upZ);
where, pos is the XYZ coordinate of the laser pulse origin position and dir is the XYZ vector direction of the laser pulse. Note the novel use of this function to represent a transmitted laser pulse where the original intention is for this to represent an intensity receiving camera. The up vector is defined with tail at the center of the LADAR pulse origin and head with respect to the pulse roll orientation.

The Scene Model simulates the geometrical surface of land, sea, air and objects that compose the scene for which sensor data will be synthesized and is typically represented as a collection of triangles. The Scene Model is a function of time and its output time must be the same as the Laser Pulse Model time for the synthesis of the resulting data at that time. The vertices of these triangles must be positioned with respect to the laser pulse origin and direction as intended in order to produce the intended data.

Triangles are the triangle collection output of the Scene Model for a time that is the same as the laser pulse time. Over time the position and orientation of the triangle vertices of the scene will change to reflect the changing positions, orientations and shapes of the objects in the scene. Below is an example of the code of communicating the scene with triangle geometry to the GPU by the Depth Buffer Computation using OpenGL:

```
glBegin(GL_TRIANGLES);
for (int i=0; i<T; 1++)
{
   for (int j=0; j<3; j++)
   {
      glVertex3f(X[i,j], Y[i,j], Z[i,j]);
   }
}
glEnd(GL_TRIANGLES);
``` where, T is the number of triangles used to define the scene and X, Y and Z are arrays with triangle index i and vertex index j. These arrays are of the xyz-axis coordinates of the vertices of the triangles of the Scene Model.

The Depth-Buffer data is an array of z order index values, at least one z order index value for each timing detector element of the sensor focal plane array. This computer graphics hardware processing can be invoked and results obtained using OpenGL by calling the glReadPixels function. Note that there is at least one z-buffer z order index value for each detector in the sensor focal plane array.

The Range Computation reads the z order index values from the depth-buffer computed with the computer graphics hardware and transforms them into range values which have linear units of length. The z-buffer is read using OpenGL as:
glReadPixels(0, 0, w, h, GL_Z_COMPONENT, GL_FLOAT, zbuf);
where, w is the width of the z-buffer and h is the height of the z-buffer and the zbuf array is where the z-buffer computational result is obtained on call return.

A first step for range computation, the depth calculation, is where the z order index values that are read out from the OpenGL graphics engine are converted to a linear depth value. This computation is repeated for each z order index value in the depth-buffer. The appropriate conversion to use is a function of the graphics hardware that is employed to generate a z-buffer. The specifics may be different for different graphics hardware/software combinations without detracting from the merits or generalities of embodiments of the invention. Specifics appropriate for OpenGL include depths computed by:

```
float C1=zFar/(zFar-zNear);
float C2=C1*zNear;
int k=0;
for (int r=0; r<h; r++)
{
   for (int c=0; c<w; c++)
   {
      Depth |r,c|=C2/(C1-depthBuff[k++]);
   }
}
``` where, Depth is a w by h array of depth values.

What is important is not the specifics shown above, but that the appropriate conversion is used, which is a function of the graphics hardware that is employed to generate a depth-buffer. The specifics may be different for different graphics hardware/software. These specifics are appropriate for OpenGL.

The flash is a w by h sub-scan array of range values produced from one laser pulse that are the sensor range values at some time t, from the LADAR sensor with laser pulse at time t defined by the Laser Pulse Model and the surface of the scene at time t defined by the Scene Model. Flashes are then collected to compose an entire Scan as defined by the Laser Pulse Model and when one Scan is complete the next Scan is started giving Scan after Scan for the final synthesized LADAR range data video stream.

Summarizing in a simplistic form, the flash is the laser pulse model+the scene model+the z buffer computation+the z order index to range value transformation computation. The Scan is defined by the collection Flashes that are the result of a sequence of laser pulses with modulated orientations constructed into the Laser Pulse Model to systematically cover the scene. The Video is the sequence of Scans.

FIGS. 6 through 9 illustrate exemplary qualitative computational examples, according to some embodiments of the invention. Various computational values are shown in arrays and the size of the arrays depicted are shown for ease of illustration and understanding and should not be construed as being limiting.

Figure 6:
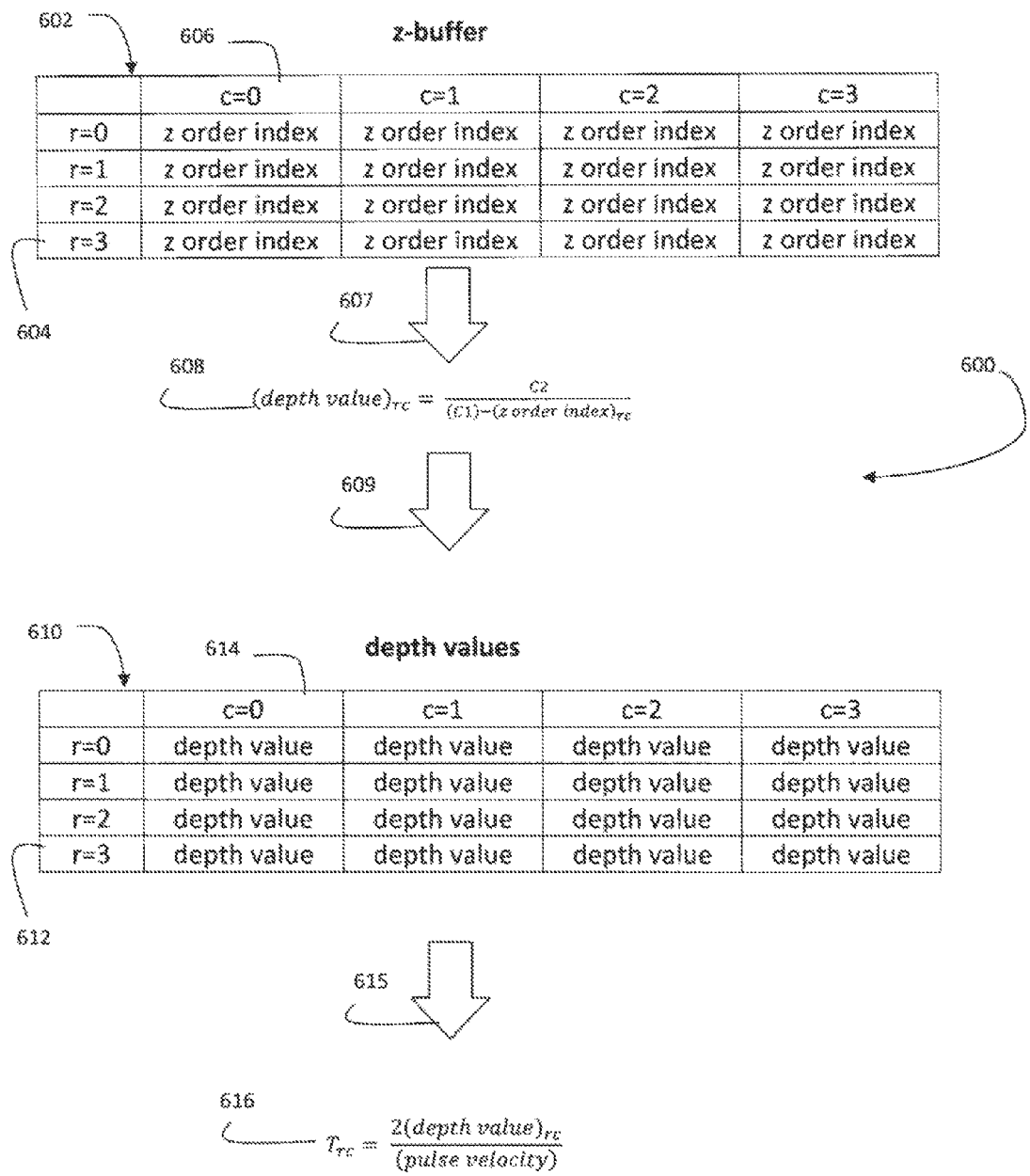
FIG. 6 is an exemplary qualitative computational example of z-buffer values converted to depth values and then converted to time values, according to some embodiments of the invention.

FIG. 6 illustrates an exemplary qualitative computational example of z-buffer values converted to depth values and then converted to time values, and is depicted as reference character 600. The hidden surface removal z-buffer (recall that the shortened term z-buffer is also used) computation produces an array 602 having rows and columns.

The z-buffer after being computed by the GPU has z order index values shown in the array 602 having rows (r) 604 and columns (c) 606. For simplicity in illustration, a 4×4 array is shown. The layout of the z order index values is used to represent the scene area where the LADAR pulse energy arrives. Following along with arrow 607, the z order index values are then converted to depth values by the equation depicted as reference character 608:

$$(\text{depth value})_{rc} = \frac{C2}{(C1) - (z \text{ order index})_{rc}}$$

where C1 and C2 are constants and the z order index value the particular element value at the specified row (r) and column (c).

Following along with arrow 609, the depth values are depicted in a 4×4 array 610 having rows (r) 612 and columns (c) 614. Following along with arrow 615, the depth values are then converted to time values by the equation depicted as reference character 616:

$$T_{rc} = \frac{2(\text{depth value})_{rc}}{(\text{pulse velocity})}$$

where the depth value at the specified row (r) and column (c) is used. The time values, ($T_{r,c}$), are the travel times for the leading edge of the pulse energy to leave the sensor, reflect off the scene, and arrive back at the sensor.

Figure 7:
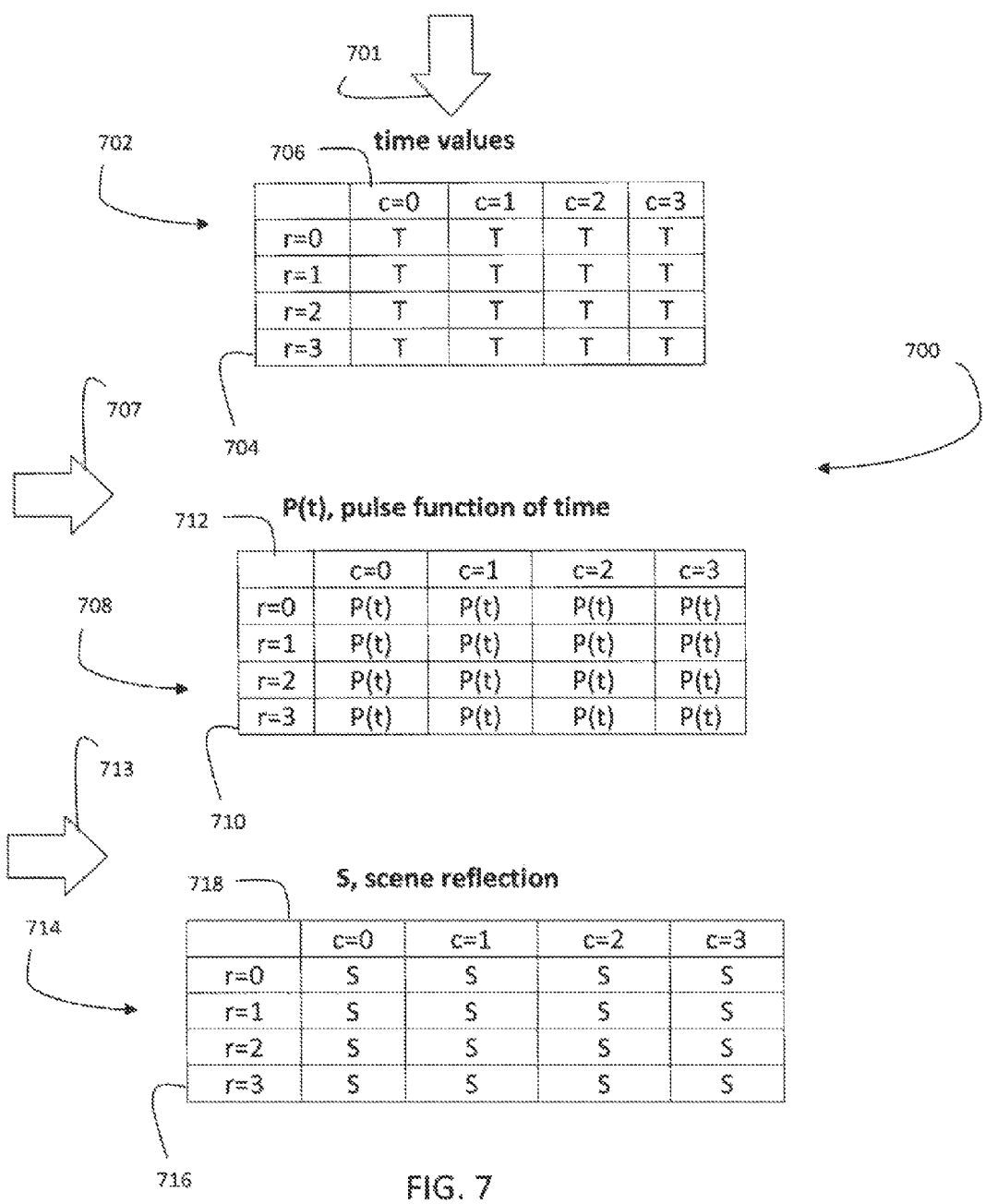
FIG. 7 is an exemplary qualitative example depiction of computed time values, received pulse functions, and received scene reflection factors, according to some embodiments of the invention.

FIG. 7 illustrates an exemplary qualitative example depiction of computed time values, received pulse functions, and received scene reflection factors, and is depicted as reference character 700. The time value computation 616 from FIG. 6 produces a time value array 702 having rows (r) 704 and columns (c) 706. Arrow 701 depicts the carryover process from FIG. 6.

Pulse functions (pulses as a function of time), P(t), are received (shown as arrow 707), and are depicted as a 4×4 array 708 having rows (r) 710 and columns (c) 712. The scene reflection factors, S, are received (shown as arrow 713), and are depicted as a 4×4 array 714, having elements for each row (r) 716 and column (c) 718 combination. Each row (r) 716 and column (c) 718 combination represents a particular angular direction that a part of the energy pulse travels in, a portion of the scene that the energy pulse reflects from, and the resulting round trip travel time of that part of the energy pulse.

Figure 8:
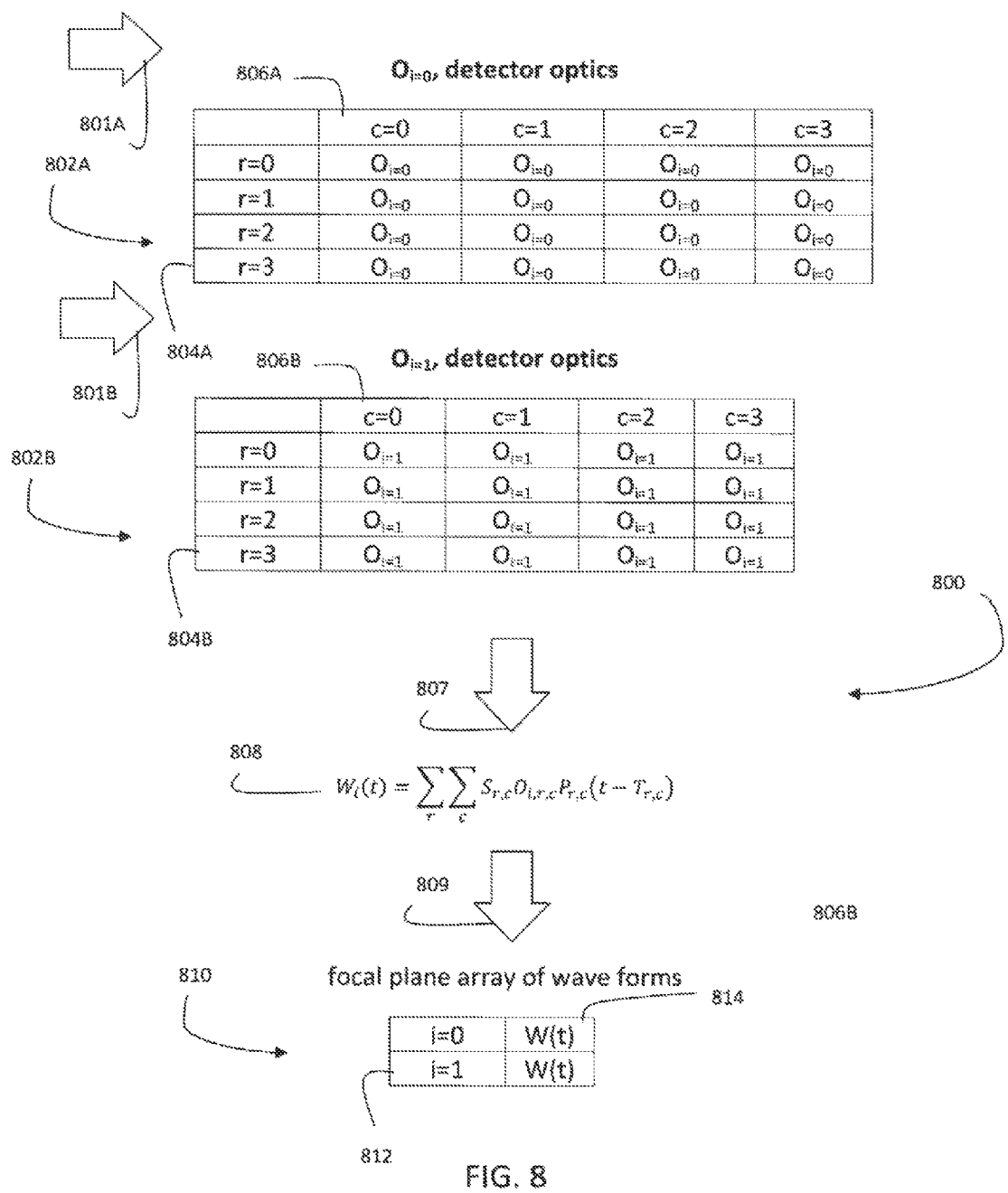
FIG. 8 is an exemplary qualitative computational example of computing resultant waveforms as a function of time for dedicated detectors, according to some embodiments of the invention.

FIG. 8 illustrates an exemplary qualitative computational example of computing resultant waveforms as a function of time for dedicated detectors, and is depicted as reference character 800. Detector optics focus the energy arriving (depicted as arrows 801A & 801B) back at the sensor for each detector. Two detector optics arrays 802A and 802B (each depicted as a 4×4 array, one for a detector referred to as "detector 0" and the other referred to as "detector 1") are shown. The first detector optics array 802A is synonymous with "detector 0" and the second detector optics array 802B is synonymous with "detector 1."

Each array (802A & 802B) have rows (r) 804A & 804B and columns (c) 806A & 806B. Together with the scene reflections (reference character 714 in FIG. 7) and the pulse functions (reference character 708 in FIG. 7), arrow 807 is followed to the equation shown as reference character 808:

$$W_i(t) = \sum_r \sum_c S_{r,c} O_{i,r,c} P_{r,c}(t - T_{r,c})$$

which computes a wave form that is the magnitude of the energy detected as a function of time.

The resultant waveforms as a function of time (from the reference character 808 equation) are depicted (following arrow 809) as a focal plane array of wave forms 810. The focal plane array wave form 810 having rows 812 for detector 0 and detector 1 and columns 814 for the resultant waveforms coinciding with each detector.

Figure 9:
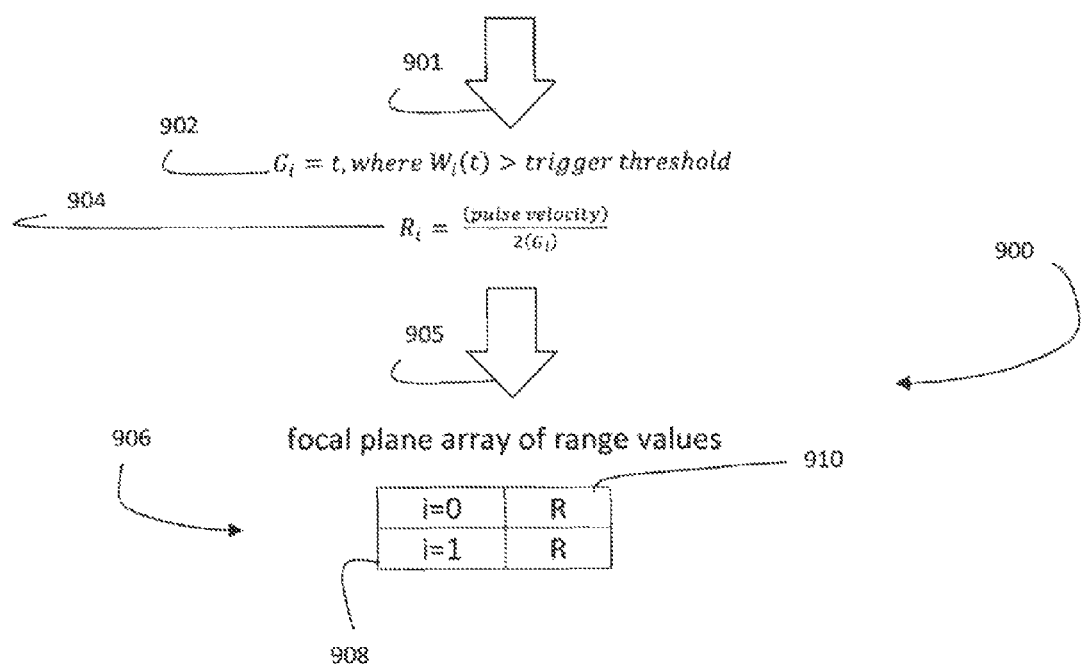
FIG. 9 is an exemplary qualitative computational example of determining linear distance range values, according to some embodiments of the invention.

FIG. 9 illustrates an exemplary qualitative computational example of determining linear distance range values, and is depicted as reference character 900. For each detector in the focal plane array 810 (FIG. 8), the resulting wave form is processed (arrow 901) to determine a set of trigger times, G, using reference character equation 902:

$G_i = t$, where $W_i(t)$<trigger threshold.

The trigger times are then scaled by the speed of the energy pulse to arrive at a linear distance range value, using the equation depicted by reference character 904:

$$R_i = \frac{(\text{pulse velocity})}{2(G_i)}$$

with the coinciding range values represented (following arrow 905) as a focal plane array of sets of range values 906. The focal plane array of range values 906 has rows 908 for detector 0 and detector 1 and columns 910 for the resultant range values coinciding with each detector.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A method for simulating sensor range data using a non-transitory computer-readable medium, comprising:
providing an actual sensor associated with a navigation unit, and a virtual sensor associated with a graphics processing unit, wherein said actual sensor is defined in an actual three-dimensional space frame of reference;
receiving a pulse model configuration with said virtual sensor, wherein said pulse model configuration defines the parameters for said virtual sensor, wherein said pulse model is defined in three-dimensional space frame of reference;

electronically initializing said pulse model configuration by generating an initial discrete energy pulse at time t, according to the parameters for said virtual sensor, wherein the energy transmitted by said pulse model configuration is in the same direction as said actual sensor's transmitted pulse defined in three-dimensional space frame of reference;

receiving a scene model configuration with said virtual sensor, and electronically initializing said scene model configuration using the three-dimensional space frame of reference of said pulse model configuration, wherein said scene model configuration is defined by a set of points, lines connecting said set of points, said lines forming a collection of triangles;

receiving an actual pulse from said actual sensor with said navigation unit, wherein said actual pulse is defined by a time, location, and orientation in a three-dimensional x, y, z, space frame of reference of said scene model configuration;

receiving scene location and orientation of land, sea, air, and objects composing said scene model, including the pose of the scene target model in the scene coordinate frame of reference;

electronically generating a hidden surface removal z-buffer using said scene model associated with time t from said scene model and said pulse position and orientation at time t from said pulse energy model, and initializing said hidden surface removal z-buffer to an initial value; and electronically transforming said hidden surface removal z-buffer data into range data values defining a simulated range image.

2. The method according to claim 1, wherein said electronically transforming said hidden surface removal z-buffer data task, comprises:

receiving pulse intensity ($P_{r,c}(t)$) as a function of time (t) and view angle (r,c), where t=0 for the leading edge of the pulse as it leaves the sensor and where the view angle is for each hidden surface removal z-buffer element row (r) and column (c);

receiving an energy focusing optics ($O_{i,r,c}$) scaling factor as a function of view angle (r,c) for each sensor detector timing element (i);

computing the time ($T_{r,c}$) for the leading edge of the laser energy pulse to travel from the sensor, arrive at the Scene surface and return to the sensor for each hidden surface removal z-buffer row (r) and column (c) element;

generating a pulse energy scaling factor based on scene reflection, energy divergence with distance and atmospheric attenuation ($S_{r,c}$) for each row (r) and column (c) element of the scene;

computing a pulse energy wave form $W_i(t)$ impinging on each sensor detector timing element (i) as a function of time (t), wherein $$W_i(t) = \sum_r \sum_c S_{r,c} O_{i,r,c} P_{r,c}(t - T_{r,c});$$

processing each of said pulse energy wave form to determine a set of timing element trigger times ($G_i$) and then multiply by half the pulse velocity to obtain a set of range values ($R_i$) for each sensor detector timing element (i).

3. The method according to claim 1, further comprising outputting said simulated range image in a tangible medium.

4. The method according to claim 3, wherein said tangible medium is a visual display screen.

5. A non-transitory computer readable medium having stored thereon a plurality of computer executable instructions for simulating sensor range data using an actual sensor associated with a navigation unit and a virtual sensor associated with a graphics processing unit, wherein said actual sensor is defined in an actual three-dimensional space frame of reference, that, when executed by a computer including said graphics processing unit, causes the computer to:

receive a pulse model configuration with said virtual sensor, wherein said pulse model configuration defines the parameters for said virtual sensor, wherein said pulse model is defined in three-dimensional space frame of reference;

initialize said pulse model configuration by generating an initial discrete energy pulse at time t, according to the parameters for said virtual sensor, wherein the energy transmitted by said pulse model configuration is in the same direction as said actual sensor's transmitted pulse defined in three-dimensional space frame of reference;

receive a scene model configuration with said virtual sensor, and electronically initialize said scene model configuration using the three-dimensional space frame of reference of said pulse model configuration, wherein said scene model configuration is defined by a set of points, lines connecting said set of points, said lines forming a collection of triangles;

receive an actual pulse from said actual sensor with said navigation unit, wherein said actual pulse is defined in an x, y, z, location and orientation in the three-dimensional space frame of reference of said scene model configuration;

receive scene location and orientation of land, sea, air, and objects composing said scene model, including the pose of the scene target model in the scene coordinate frame of reference;

generate a hidden surface removal z-buffer using said scene model associated with time t from said scene model and said pulse position and orientation at time t from said pulse energy model, and initializing said hidden surface removal z-buffer to an initial value; and transform said hidden surface removal z-buffer data into range data values defining a simulated range image.

6. The non-transitory computer-readable medium according to claim 5, wherein said electronically transforming said hidden surface removal z-buffer data task, comprises:

receiving pulse intensity ($P_{r,c}(t)$) as a function of time (t) and view angle (r,c), where t=0 for the leading edge of the pulse as it leaves the sensor and where the view angle is for each Hidden surface removal z-buffer element row (r) and column (c);

receiving an energy focusing optics ($O_{i,r,c}$) scaling factor as a function of view angle (r,c) for each sensor detector timing element (i);

computing the time ($T_{r,c}$) for the leading edge of the laser energy pulse to travel from the sensor, arrive at the Scene surface and return to the sensor for each Hidden surface removal z-buffer row (r) and column (c) depth element, by taking two times the depth divided by the pulse velocity;

generating a pulse energy scaling factor based on scene reflection, energy divergence with distance and atmospheric attenuation ($S_{r,c}$) for each row (r) and column (c) element of the scene;

computing a pulse energy wave form $W_i(t)$ impinging on each sensor detector timing element (i) as a function of time (t), wherein $$W_i(t) = \sum_r \sum_c S_{r,c} O_{i,r,c} P_{r,c}(t - T_{r,c});$$

processing each of said pulse energy wave form to determine a set of timing element trigger times ($G_i$) and then multiply by half the pulse velocity to obtain a set of range values ($R_i$) for each sensor detector timing element (i).

7. The non-transitory computer readable medium according to claim 5, further comprising outputting said simulated range image in a tangible medium.

8. The non-transitory computer readable medium according to claim 7, wherein said tangible medium is a visual display screen.

\* \* \* \* \*